US006963090B2

(12) United States Patent
Passlack et al.

(10) Patent No.: US 6,963,090 B2
(45) Date of Patent: Nov. 8, 2005

(54) ENHANCEMENT MODE METAL-OXIDE-SEMICONDUCTOR FIELD EFFECT TRANSISTOR

(75) Inventors: Matthias Passlack, Chandler, AZ (US); Olin L. Hartin, Phoenix, AZ (US); Marcus Ray, Tempe, AZ (US); Nicholas Medendorp, Santa Barbara, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/339,379

(22) Filed: Jan. 9, 2003

(65) Prior Publication Data

US 2004/0137673 A1 Jul. 15, 2004

(51) Int. Cl.[7] .............................................. H01L 31/072
(52) U.S. Cl. ......................... 257/187; 257/24; 257/27; 257/189; 257/192; 257/194; 257/631
(58) Field of Search ............................. 257/24, 27, 187, 257/190, 192, 194, 410, 411, 631, 189

(56) References Cited

U.S. PATENT DOCUMENTS

| | | | |
|---|---|---|---|
| 3,617,951 A | 11/1971 | Anderson | |
| 3,758,199 A | 9/1973 | Thaxter | |
| 3,818,451 A | 6/1974 | Coleman | |
| 4,174,504 A | 11/1979 | Chenausky et al. | |
| 4,177,094 A | 12/1979 | Kroon | |
| 4,298,247 A | 11/1981 | Michelet et al. | |
| 4,378,259 A | 3/1983 | Hasegawa et al. | |
| 4,447,116 A | 5/1984 | King et al. | |
| 4,525,871 A | 6/1985 | Foyt et al. | |
| 4,626,878 A | 12/1986 | Kuwano et al. | |
| 4,695,120 A | 9/1987 | Holder | |
| 4,723,321 A | 2/1988 | Saleh | |
| 4,801,184 A | 1/1989 | Revelli | |
| 4,804,866 A | 2/1989 | Akiyama | |
| 4,843,609 A | 6/1989 | Ohya et al. | |
| 4,866,489 A | 9/1989 | Yokogawa et al. | |
| 4,873,558 A | 10/1989 | Antreasyan et al. | |
| 4,876,218 A | 10/1989 | Pessa et al. | |
| 5,028,563 A | 7/1991 | Feit et al. | |
| 5,057,694 A | 10/1991 | Idaka et al. | |
| 5,087,829 A | 2/1992 | Ishibashi et al. | |
| 5,140,387 A | 8/1992 | Okazaki et al. | |
| 5,148,504 A | 9/1992 | Levi et al. | |
| 5,166,761 A | 11/1992 | Olson et al. | |
| 5,188,976 A | 2/1993 | Kume et al. | |
| 5,216,359 A | 6/1993 | Makki et al. | |
| 5,238,877 A | 8/1993 | Russell | |

(Continued)

FOREIGN PATENT DOCUMENTS

JP          02071563          12/1990

OTHER PUBLICATIONS

"InSb n–Channel Enhancement Mode Misfet Grown by Molicular Beam Epitaxy"; Electronic Letters; Feb. 16, 1999; pp. 289; vol. 25, No. 4.

Liu, Bing–Der et al.; "Detailed Investigation of InSb p–Channel Metal–Exide–Semiconductor Field Effect Transistor Prepared by Photo–Enhanced Chemical Vapor Deposition"; IEEE Transactions on Electron Devices; 1995; pp 795–803; No. 5; IEEE; NY, US.

*Primary Examiner*—Andy Huynh
(74) *Attorney, Agent, or Firm*—Patricia S. Goddard (57) ABSTRACT

An implant-free enhancement mode metal-oxide semiconductor field effect transistor (EMOSFET) is provided. The EMOSFET has a III-V compound semiconductor substrate and an epitaxial layer structure overlying the III-V compound semiconductor substrate. The epitaxial material layer has a channel layer and at least one doped layer. A gate oxide layer overlies the epitaxial layer structure. The EMOSFET further includes a metal gate electrode overlying the gate oxide layer and source and drain ohmic contacts overlying the epitaxial layer structure.

13 Claims, 4 Drawing Sheets

U.S. PATENT DOCUMENTS

| | | |
|---|---|---|
| 5,262,659 A | 11/1993 | Grudkowski et al. |
| 5,268,327 A | 12/1993 | Vernon |
| 5,313,058 A | 5/1994 | Friederich et al. |
| 5,315,128 A | 5/1994 | Hunt et al. |
| 5,362,972 A | 11/1994 | Yazawa et al. |
| 5,362,998 A | 11/1994 | Iwamura et al. |
| 5,365,477 A | 11/1994 | Cooper, Jr. et al. |
| 5,371,621 A | 12/1994 | Stevens |
| 5,387,811 A | 2/1995 | Saigoh |
| 5,410,622 A | 4/1995 | Okada et al. |
| 5,446,719 A | 8/1995 | Yoshida et al. |
| 5,477,363 A | 12/1995 | Matsuda |
| 5,488,237 A * | 1/1996 | Kuwata ..................... 257/194 |
| 5,508,554 A | 4/1996 | Takatani et al. |
| 5,510,665 A | 4/1996 | Conley |
| 5,523,602 A | 6/1996 | Horiuchi et al. |
| 5,528,209 A | 6/1996 | Macdonald et al. |
| 5,540,785 A | 7/1996 | Dennard et al. |
| 5,548,141 A | 8/1996 | Morris et al. |
| 5,559,368 A | 9/1996 | Hu et al. |
| 5,570,226 A | 10/1996 | Ota |
| 5,574,296 A | 11/1996 | Park et al. |
| 5,574,589 A | 11/1996 | Feuer et al. |
| 5,574,744 A | 11/1996 | Gaw et al. |
| 5,578,162 A | 11/1996 | D'Asaro et al. |
| 5,585,167 A | 12/1996 | Satoh et al. |
| 5,585,288 A | 12/1996 | Davis et al. |
| 5,635,453 A | 6/1997 | Pique et al. |
| 5,642,371 A | 6/1997 | Tohyama et al. |
| 5,666,376 A | 9/1997 | Cheng |
| 5,667,586 A | 9/1997 | Ek et al. |
| 5,674,813 A | 10/1997 | Nakamura et al. |
| 5,679,947 A | 10/1997 | Doi et al. |
| 5,684,302 A | 11/1997 | Wersing et al. |
| 5,693,140 A | 12/1997 | McKee et al. |
| 5,719,417 A | 2/1998 | Roeder et al. |
| 5,753,934 A | 5/1998 | Yano et al. |
| 5,754,714 A | 5/1998 | Suzuki et al. |
| 5,760,740 A | 6/1998 | Blodgett |
| 5,772,758 A | 6/1998 | Collins et al. |
| 5,787,175 A | 7/1998 | Carter |
| 5,831,960 A | 11/1998 | Jiang et al. |
| 5,838,053 A | 11/1998 | Bevan et al. |
| 5,864,171 A | 1/1999 | Yamamoto et al. |
| 5,882,948 A | 3/1999 | Jewell |
| 5,905,571 A | 5/1999 | Butler et al. |
| 5,919,515 A | 7/1999 | Yano et al. |
| 5,919,522 A | 7/1999 | Baum et al. |
| 5,930,611 A | 7/1999 | Okamoto |
| 5,937,115 A | 8/1999 | Domash |
| 5,945,718 A * | 8/1999 | Passlack et al. ............ 257/410 |
| 5,959,308 A | 9/1999 | Shichijo et al. |
| 5,976,953 A | 11/1999 | Zavracky et al. |
| 5,985,404 A | 11/1999 | Yano et al. |
| 5,987,196 A | 11/1999 | Noble |
| 5,997,638 A | 12/1999 | Copel et al. |
| 5,998,781 A | 12/1999 | Vawter et al. |
| 5,998,819 A | 12/1999 | Yokoyama et al. |
| 6,022,671 A | 2/2000 | Binkley et al. |
| 6,049,110 A | 4/2000 | Koh |
| 6,051,874 A | 4/2000 | Masuda |
| 6,059,895 A | 5/2000 | Chu et al. |
| 6,064,783 A | 5/2000 | Congdon et al. |
| 6,080,378 A | 6/2000 | Yokota et al. |
| 6,110,813 A | 8/2000 | Ota et al. |
| 6,110,840 A | 8/2000 | Yu et al. |
| 6,113,225 A | 9/2000 | Miyata et al. |
| 6,140,169 A | 10/2000 | Kawai et al. |
| 6,140,746 A | 10/2000 | Miyashita et al. |
| 6,153,916 A * | 11/2000 | Roth et al. .................. 257/409 |
| 6,159,781 A * | 12/2000 | Pan et al. ................... 438/167 |
| 6,181,920 B1 | 1/2001 | Dent et al. |
| 6,198,119 B1 | 3/2001 | Nabatame et al. |
| 6,204,525 B1 | 3/2001 | Sakurai et al. |
| 6,232,242 B1 | 5/2001 | Hata et al. |
| 6,233,435 B1 | 5/2001 | Wong |
| 6,239,012 B1 | 5/2001 | Kinsman |
| 6,271,069 B1 * | 8/2001 | Chen et al. .................. 438/204 |
| 6,278,541 B1 | 8/2001 | Baker |
| 6,291,866 B1 | 9/2001 | Wallace et al. |
| 6,297,598 B1 | 10/2001 | Wang et al. |
| 6,307,996 B1 | 10/2001 | Nashimoto et al. |
| 6,326,667 B1 | 12/2001 | Sugiyama et al. |
| 6,341,851 B1 | 1/2002 | Takayama et al. |
| 6,355,945 B1 | 3/2002 | Kadota et al. |
| 6,362,558 B1 | 3/2002 | Fukui |
| 6,376,337 B1 | 4/2002 | Wang et al. |
| 6,392,253 B1 | 5/2002 | Saxena |
| 6,415,140 B1 | 7/2002 | Benjamin et al. |
| 6,419,849 B1 | 7/2002 | Qiu et al. |
| 6,445,724 B2 | 9/2002 | Abeles |
| 6,452,232 B1 | 9/2002 | Adan |
| 6,477,285 B1 | 11/2002 | Shanley |
| 6,496,469 B1 | 12/2002 | Uchizaki |
| 6,498,358 B1 | 12/2002 | Lach et al. |
| 6,501,121 B1 | 12/2002 | Yu et al. |
| 6,504,189 B1 | 1/2003 | Matsuda et al. |
| 6,524,651 B2 | 2/2003 | Gan et al. |
| 6,538,359 B1 | 3/2003 | Hiraku et al. |
| 6,642,600 B2 * | 11/2003 | Narazaki et al. ............ 257/513 |
| 2001/0020278 A1 | 9/2001 | Saito |
| 2001/0036142 A1 | 11/2001 | Kadowaki et al. |
| 2001/0055820 A1 | 12/2001 | Sakurai et al. |
| 2002/0021855 A1 | 2/2002 | Kim |
| 2002/0076878 A1 | 6/2002 | Wasa et al. |
| 2002/0079576 A1 | 6/2002 | Seshan |
| 2002/0140012 A1 | 10/2002 | Droopad |
| 2002/0145168 A1 | 10/2002 | Bojarczuk et al. |
| 2002/0179000 A1 | 12/2002 | Lee et al. |
| 2002/0195610 A1 | 12/2002 | Klosowiak |

* cited by examiner

-PRIOR ART-

ENHANCEMENT MODE METAL-OXIDE-SEMICONDUCTOR FIELD EFFECT TRANSISTOR

FIELD OF THE INVENTION

The present invention relates generally to compound semiconductor field effect devices and more specifically to enhancement mode metal-oxide-compound semiconductor field effect transistors and methods for fabricating the same.

BACKGROUND OF THE INVENTION

The enhancement-mode metal-oxide-semiconductor field effect transistor (EMOSFET) is one of the most widely used devices in the design of metal-oxide semiconductor (MOS) integrated circuits. Silicon complementary MOS (CMOS) technology is a mature technology for EMOSFET design, offering simplicity in design and low power consumption. However, Group III-V compound semiconductor technology continues to serve as an attractive technology for EMOSFET design due to its superior speed/power performance and efficiency.

One class of EMOSFETs is designed with self-aligned ion implants to form low resistivity source and drain extensions. However, manufacturing III-V compound semiconductor EMOSFETs with ion implanted source and drain extensions is difficult. The implant material can act as both a donor or an acceptor depending on its association with either the Group III or the Group V site in the lattice, respectively. Further, annealing temperatures used to form the source and drain extensions, typically higher than 700° C. in n-channel devices, may be incompatible with the semiconductor/gate oxide interface stability. The ion implantation process used to form the source and drain extension also may result in an undesirably high trap density at the semiconductor/gate oxide interface. Moreover, formation of the source and drain extensions requires in most technologies that the gate electrode be used as a mask and thus be formed before ion implantation, therefore limiting manufacturing flexibility. Further, the source and drain extensions of such devices typically have sheet resistances of greater than 300 to 400 ohms/square when annealed at temperatures of about 800° C. and above, and of greater than about 500 ohms/square when annealed at temperatures of about 700° C.

Accordingly, a need exists for an "implant-free" III-V compound semiconductor EMOSFET. As used herein, the term "implant-free" shall mean free from source and drain extensions formed by ion implantation. A need also exists for a method for fabricating an implant-free enhancement mode metal-oxide-semiconductor field effect transistor. Other desirable features and characteristics of the present invention will become apparent from the subsequent description and the appended claims, taken in conjunction with the accompanying drawings.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

The following detailed description is of exemplary embodiments only and is not intended to limit the invention or the application and uses of the invention. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
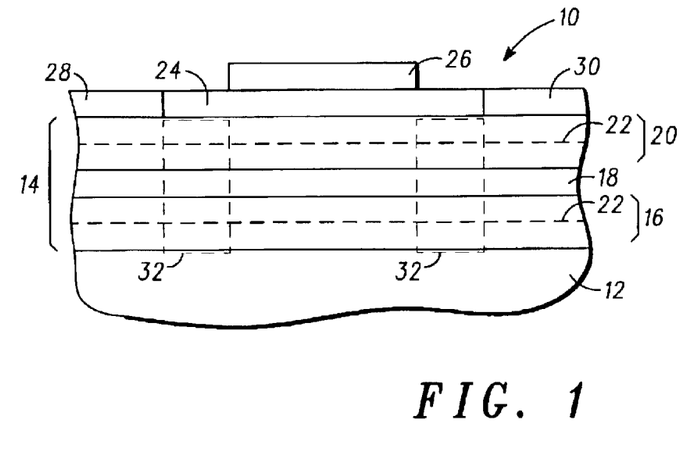
FIG. 1 illustrates schematically, in cross section, an enhancement mode metal-oxide-semiconductor field effect transistor in accordance with an exemplary embodiment of the present invention.

FIG. 1 illustrates schematically, in cross section, an enhancement mode compound semiconductor MOSFET device 10 in accordance with one exemplary embodiment of the present invention. Device 10 has a substrate 12 formed of any suitable monocrystalline III-V compound semiconductor material. Preferably, substrate 12 is a high quality monocrystalline gallium arsenide (GaAs) substrate as used in the semiconductor industry.

An epitaxial layer structure 14 overlies substrate 12. Epitaxial layer structure 14 comprises a buffer layer 16, a channel layer 18 and a spacer layer 20. Buffer layer 16, channel layer 18 and spacer layer 20 each may be formed of any suitable III-V material, although preferably buffer layer 16, channel layer 18 and spacer layer 20 are each formed of a different III-V material. In a preferred embodiment of the present invention, buffer layer 16 is formed of gallium arsenide (GaAs), channel layer 18 comprises indium gallium arsenide (InGaAs) and spacer layer 20 comprises aluminum gallium arsenide (AlGaAs). It will be appreciated that, while buffer layer 16 is illustrated in FIG. 1 as a layer separate from substrate 12, buffer layer 16 and substrate 12 may form one continuous layer depending on the materials from which these layers are formed.

Epitaxial layer structure 14 also comprises at least one doped layer, such as doped layer 22 illustrated in FIG. 1. While epitaxial layer structure 14 is illustrated in FIG. 1 as having two doped layers, it will be appreciated that epitaxial layer structure 14 may have one, two or more doped layers. Doped layers 22 may be positioned above, below and/or within channel layer 18. Doped layers 22, and any additional doped layers, may comprise any suitable doping component known in the semiconductor industry, such as, for example, silicon (Si) (n-channel devices) and beryllium (Be) (p-channel devices). As described in more detail below, the doped layers of epitaxial layer structure 14 may be selected, that is, the doping levels of doped layers 22 may be selected, such that, for a particular MOSFET configuration, enhancement mode operation is achieved.

A gate oxide layer 24 overlies epitaxial layer structure 14. Preferably, gate oxide layer 24 comprises gallium oxide ($Ga_2O_3$), although gate oxide layer 24 may comprise any other suitable oxide material.

A metal gate electrode 26 that is stable in the presence of the gate oxide material overlies gate oxide layer 24. As described in more detail below, the material for metal gate electrode 24 may be selected to have a work function such that for a particular MOSFET configuration enhancement mode operation is achieved.

Source and drain ohmic contacts 28, 30 are formed overlying epitaxial layer structure 14 and are separated from metal gate electrode 26 by source and drain access regions 32. Source and drain access regions 32 comprise those areas of epitaxial layer structure 14 between the source ohmic contact 28 and metal gate electrode 26 and between drain ohmic contact 30 and metal gate electrode 26, respectively. Source and drain ohmic contacts 28, 30 may be formed of any suitable electrically conductive material as is known in the semiconductor industry.

Enhancement mode operation of device 10 may be realized based on a relationship between the work function of metal gate electrode 26 and the dopant level of doped layers 22. While the doped layers 22 of epitaxial layer structure 14 serve as a source for free carriers, thus eliminating the need for ion-implanted source and drain extensions within epitaxial layer structure 14, without a suitable metal gate electrode, doped layers 22 may adversely shift the threshold voltage of device 10 preventing enhancement mode operation. For example, doped layers 22 may cause the threshold voltage of an n-channel MOSFET to have a negative value, thus preventing enhancement mode operation. Use of a metal gate electrode 26 having a suitably high work function may compensate for this shift and may result in a threshold voltage greater than zero, thus enabling enhancement mode operation. Similarly, doped layers 22 may cause the threshold voltage of a p-channel MOSFET to have a positive value, thus preventing enhancement mode operation. Use of a metal gate electrode 26 having a suitably low work function may compensate for this shift and may result in a threshold voltage less than zero, thus enabling enhancement mode operation.

Without intending to be limited to any particular theory, in one exemplary embodiment of the invention, the relationship between the work function of metal gate electrode 26 and the doping level of doped layers 22 may be obtained from the following first order equations:

$$\rho_s = 1/(Q_s \times \mu \times q), \quad (1)$$

where $\rho_s$ is the sheet resistivity (ohms/square) of the source and drain access regions 32, $\mu$ is the channel mobility and q is the electronic charge ($1.6 \times 10^{-19}$ As) and $$Q_s = (\epsilon_{ox} \times (\Phi_m - \Phi(0)))/(t_{ox} \times q), \quad (2)$$

where $Q_s$ is the sheet charge ($cm^{-2}$) of doped layers 22 measured at source and drain access regions 32, $\epsilon_{ox}$ is the dielectric constant of gate oxide layer 24, $t_{ox}$ is the thickness of gate oxide layer 24, $\Phi_m$ is the work function of metal gate electrode 26, and $\Phi(0)$ is the reference work function of metal gate electrode 26 for a specific threshold voltage and no doping layers ($\Phi(0)$ may be obtained by two-dimensional device simulation). It will be appreciated that while a relationship between the work function of metal gate electrode 26 and the doping level of doped layers 22 may be obtained from the above-described first order equations, such a relationship may be obtained from other higher order equations.

Tables 1 and 2 illustrate one exemplary relationship between the work function of metal gate electrode 26 and the doping levels of doped layers 22 for an n-channel MOSFET. In this example, the sheet resistance $\rho_s$ and sheet charge $Q_s$ are calculated for a threshold voltage $V_T$ of 0.3V using a dielectric constant $\epsilon_{ox}$ of 20, a channel mobility $\mu$ of 5900 $cm^2/Vs$, a $\Phi(0)$ of 4.6 eV and a charge centroid located at the oxide-epitaxial layer structure interface. The actual position of the charge centroid may vary with operating conditions and epitaxial layer structure configuration and may deviate to some extent from the position assumed in this example.

TABLE 1

$Q_s$ ($cm^{-2}$), $V_T$ = 0.3 V

| $\Phi_m$ (eV) | $t_{ox}$ (nm) 50 | 40 | 30 | 20 | 10 |
|---|---|---|---|---|---|
| 4.7 | $2.2 \times 10^{11}$ | $2.8 \times 10^{11}$ | $3.7 \times 10^{11}$ | $5.5 \times 10^{11}$ | $1.1 \times 10^{12}$ |
| 4.8 | $4.4 \times 10^{11}$ | $5.5 \times 10^{11}$ | $7.4 \times 10^{11}$ | $1.1 \times 10^{12}$ | $2.2 \times 10^{12}$ |
| 4.9 | $6.6 \times 10^{11}$ | $8.3 \times 10^{11}$ | $1.1 \times 10^{12}$ | $1.7 \times 10^{12}$ | $3.3 \times 10^{12}$ |
| 5.0 | $8.8 \times 10^{11}$ | $1.1 \times 10^{12}$ | $1.5 \times 10^{12}$ | $2.2 \times 10^{12}$ | $4.4 \times 10^{12}$ |
| 5.1 | $1.1 \times 10^{12}$ | $1.4 \times 10^{12}$ | $1.8 \times 10^{12}$ | $2.8 \times 10^{12}$ | $5.5 \times 10^{12}$ |
| 5.2 | $1.3 \times 10^{12}$ | $1.7 \times 10^{12}$ | $2.2 \times 10^{12}$ | $3.3 \times 10^{12}$ | $6.6 \times 10^{12}$ |
| 5.3 | $1.5 \times 10^{12}$ | $1.9 \times 10^{12}$ | $2.6 \times 10^{12}$ | $3.9 \times 10^{12}$ | $7.7 \times 10^{12}$ |
| 5.4 | $1.8 \times 10^{12}$ | $2.2 \times 10^{12}$ | $2.9 \times 10^{12}$ | $4.4 \times 10^{12}$ | $8.8 \times 10^{12}$ |
| 5.5 | $2.0 \times 10^{12}$ | $2.5 \times 10^{12}$ | $3.3 \times 10^{12}$ | $5.0 \times 10^{12}$ | $9.9 \times 10^{12}$ |
| 5.6 | $2.2 \times 10^{12}$ | $2.8 \times 10^{12}$ | $3.7 \times 10^{12}$ | $5.5 \times 10^{12}$ | $1.1 \times 10^{13}$ |
| 5.7 | $2.4 \times 10^{12}$ | $3.0 \times 10^{12}$ | $4.1 \times 10^{12}$ | $6.1 \times 10^{12}$ | $1.2 \times 10^{13}$ |

TABLE 2

$\rho_s$ (Ohm/Square), $V_T$ = 0.3 V

| $\Phi_m$ (eV) | $t_{ox}$ (nm) 50 | 40 | 30 | 20 | 10 |
|---|---|---|---|---|---|
| 4.7 | 4786 | 3829 | 2871 | 1914 | 957 |
| 4.8 | 2393 | 1914 | 1436 | 957 | 479 |
| 4.9 | 1595 | 1276 | 957 | 638 | 319 |
| 5.0 | 1196 | 957 | 718 | 479 | 239 |
| 5.1 | 957 | 766 | 574 | 383 | 191 |
| 5.2 | 798 | 638 | 479 | 319 | 160 |
| 5.3 | 684 | 547 | 410 | 273 | 137 |
| 5.4 | 598 | 479 | 359 | 239 | 120 |
| 5.5 | 532 | 425 | 319 | 213 | 106 |
| 5.6 | 479 | 383 | 287 | 191 | 96 |
| 5.7 | 435 | 348 | 261 | 174 | 87 |

Figure 2:
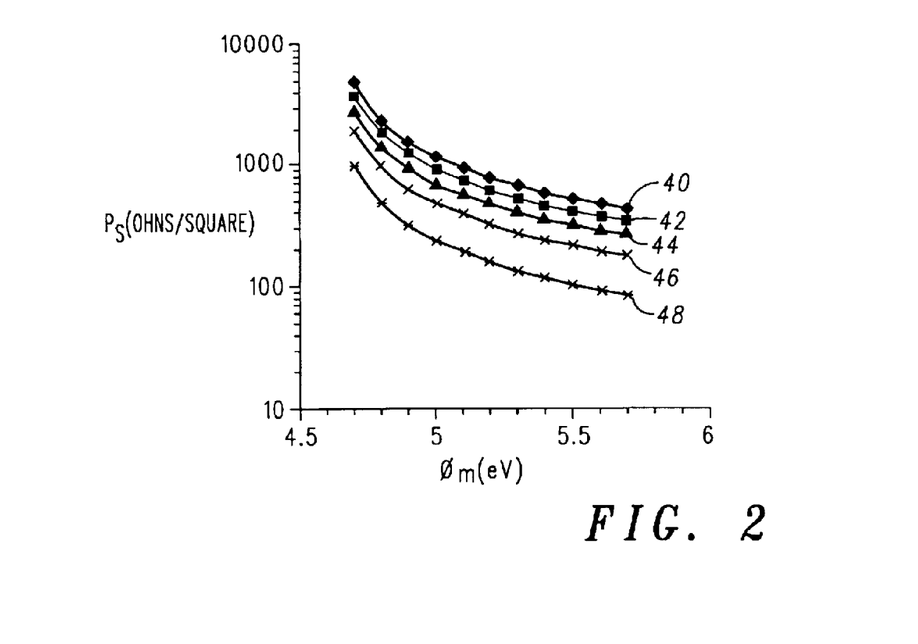
FIG. 2 is a graphical representation of the relationship between the work function of a metal gate electrode and the sheet resistance of an enhancement mode metal-oxide-semiconductor field effect transistor in accordance with an exemplary embodiment of the present invention.

FIG. 2 illustrates graphically the relationship between the work function of metal gate electrode 26 and the sheet resistance $\rho_s$ of source and drain access regions 32 for five different gate oxide thicknesses where $V_T$=0.3V. Curve 40 represents the sheet resistance for a gate oxide 24 having a thickness of 50 nm, curve 42 represents the sheet resistance for a gate oxide 24 having a thickness of 40 nm, curve 44 represents the sheet resistance for a gate oxide 24 having a thickness of 30 nm, curve 46 represents the sheet resistance for a gate oxide 24 having a thickness of 20 nm, and curve 48 represents the sheet resistance for a gate oxide 24 having a thickness of 10 nm. As is evident from the curve, the higher the work function of metal gate electrode 26 of device 10, the lower the sheet resistance. Similarly, the thinner the gate oxide 24 of device 10, the lower the sheet resistance.

Tables 3 and 4 illustrate the sheet resistance $\rho_s$ and sheet charge $Q_s$ as calculated for a threshold voltage $V_T$ of 0.5V using a dielectric constant $\epsilon_{ox}$ of 20, a channel mobility $\mu$ of 5900 cm$^2$/Vs, a reference work function $\Phi(0)$ of 4.8 eV and a charge centroid located at the oxide-epitaxial layer structure interface. Again, the actual position of the charge centroid may vary with operating conditions and epitaxial layer structure configuration and may deviate to some extent from the position assumed in this example.

TABLE 3

$Q_s$ (cm$^{-2}$), $V_T$ = 0.5 V

| $\Phi_m$ (eV) | $t_{ox}$ (nm) 50 | 40 | 30 | 20 | 10 |
|---|---|---|---|---|---|
| 4.9 | 2.2 × 10$^{11}$ | 2.8 × 10$^{11}$ | 3.7 × 10$^{11}$ | 5.5 × 10$^{11}$ | 1.1 × 10$^{12}$ |
| 5.0 | 4.4 × 10$^{11}$ | 5.5 × 10$^{11}$ | 7.4 × 10$^{11}$ | 1.1 × 10$^{12}$ | 2.2 × 10$^{12}$ |
| 5.1 | 6.6 × 10$^{11}$ | 8.3 × 10$^{11}$ | 1.1 × 10$^{12}$ | 1.7 × 10$^{12}$ | 3.3 × 10$^{12}$ |
| 5.2 | 8.8 × 10$^{11}$ | 1.1 × 10$^{12}$ | 1.5 × 10$^{12}$ | 2.2 × 10$^{12}$ | 4.4 × 10$^{12}$ |
| 5.3 | 1.1 × 10$^{12}$ | 1.4 × 10$^{12}$ | 1.8 × 10$^{12}$ | 2.8 × 10$^{12}$ | 5.5 × 10$^{12}$ |
| 5.4 | 1.3 × 10$^{12}$ | 1.7 × 10$^{12}$ | 2.2 × 10$^{12}$ | 3.3 × 10$^{12}$ | 6.6 × 10$^{12}$ |
| 5.5 | 1.5 × 10$^{12}$ | 1.9 × 10$^{12}$ | 2.6 × 10$^{12}$ | 3.9 × 10$^{12}$ | 7.7 × 10$^{12}$ |
| 5.6 | 1.8 × 10$^{12}$ | 2.2 × 10$^{12}$ | 2.9 × 10$^{12}$ | 4.4 × 10$^{12}$ | 8.8 × 10$^{12}$ |
| 5.7 | 2.0 × 10$^{12}$ | 2.5 × 10$^{12}$ | 3.3 × 10$^{12}$ | 5.0 × 10$^{12}$ | 9.9 × 10$^{12}$ |

TABLE 4

$\rho_s$ (Ohm/Square), $V_T$ = 0.5 V

| $\Phi_m$ (eV) | $t_{ox}$ (nm) 50 | 40 | 30 | 20 | 10 |
|---|---|---|---|---|---|
| 4.9 | 4786 | 3829 | 2871 | 1914 | 957 |
| 5.0 | 2393 | 1914 | 1436 | 957 | 479 |
| 5.1 | 1595 | 1276 | 957 | 638 | 319 |
| 5.2 | 1196 | 957 | 718 | 479 | 239 |
| 5.3 | 957 | 766 | 574 | 383 | 191 |
| 5.4 | 798 | 638 | 479 | 319 | 160 |
| 5.5 | 684 | 547 | 410 | 273 | 137 |
| 5.6 | 598 | 479 | 359 | 239 | 120 |
| 5.7 | 532 | 425 | 319 | 213 | 106 |

Figure 3:
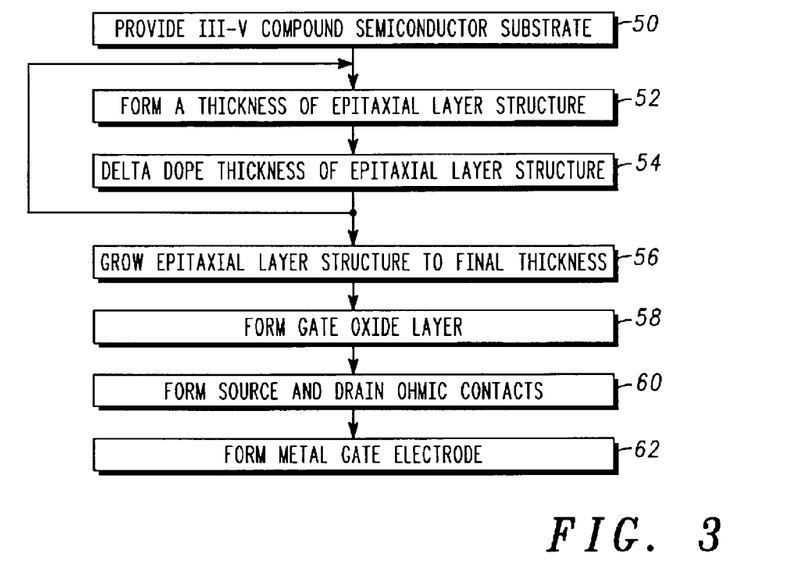
FIG. 3 is a flowchart of a method for forming an enhancement mode metal-oxide-semiconductor field effect transistor in accordance with an exemplary embodiment of the present invention.

The following example illustrates a method, in accordance with one embodiment of the invention, for fabricating an EMOSFET semiconductor structure such as structure 10 depicted in FIG. 1. Referring to FIG. 3, the method begins at step 50 by providing a monocrystalline III-V semiconductor substrate. In accordance with a preferred embodiment of the invention, the semiconductor substrate is a monocrystalline gallium arsenide (GaAs) substrate.

Next, doped epitaxial layer structure 14 is grown overlying gallium arsenide substrate 12. Epitaxial layer structure 14 is formed by growing buffer layer 16, preferably of GaAs, then growing channel layer 18, preferably of InGaAs, and then growing spacer layer 20, preferably of AlGaAs. Methods of fabricating epitaxial layer structure 14 include, but are not limited to, molecular beam epitaxy (MBE) and metal organic chemical vapor deposition (MOCVD). Preferably, epitaxial layer structure 14 is formed in an ultra high vacuum (UHV) MBE system so that it is formed with an atomically ordered and chemically clean semiconductor surface.

During growth of epitaxial layer structure 14, one or more doped layers 22 are formed above, below or within channel layer 18 using any standard doping technique. In a preferred embodiment of the invention, doped layers 22 are formed using delta doping, as is well known and practiced in the semiconductor industry. Thus, as illustrated in step 52, a thickness of epitaxial layer structure 14 is grown and, as illustrated in step 54, delta doping is then performed to form a first delta-doped layer 22. Epitaxial layer structure growth then may continue to another desired thickness and, in another embodiment of the invention, another delta doping procedure may be performed to form a second delta-doped layer. The process may continue until the desired number of delta-doped layers 22 has been formed. Epitaxial layer structure 14 then may be grown to its final thickness, as illustrated in step 56.

The level of dopant used for forming delta-doped layers 22 may be determined using models developed from the equations set forth above. For example, for an n-channel EMOSFET for which a threshold voltage of 0.3 V is desired, Tables 1 and 2 may be used. Referring to Tables 1 and 2, by way of example, if design constraints for the n-channel MOSFET require a gate oxide 26 thickness of 30 nm, and a sheet resistance below 500 ohms/square is desired, Table 2 indicates that a metal gate electrode 26 having a work function of 5.2 to 5.7 eV can be used. If iridium ($\Phi_m$=5.3 eV) is available for metal gate electrode 26, an acceptable sheet resistance of 410 ohms/square would result. Thus, Table 1 indicates that for a gate oxide thickness of 30 nm and a work function $\Phi_m$ of 5.3 eV, the delta-doping level could be about 2.6×10$^{12}$ cm$^{-2}$ or less. Accordingly, doped layers 22 could be doped to about 2.6×10$^{12}$ cm$^{-2}$ or less to achieve $V_T \geq 0.3$V, that is, to achieve an operable n-channel enhancement-mode MOSFET with a gate oxide 24 thickness of 30 nm and an iridium metal gate electrode 26. If platinum ($\Phi_m$=5.7) is available for metal gate electrode 26, Table 2 indicates that a very low sheet resistance of 261 ohms/square would result. Table 1 indicates that for a gate oxide thickness of 30 nm and a work function $\Phi_m$ of 5.7 eV, the delta-doping level could be about 4.1×10$^{12}$ cm$^{-2}$ or less. Accordingly, doped layers 22 could be doped to about 4.1×10$^{12}$ cm$^{-2}$ or less to achieve $V_T \geq 0.3$V, that is, to achieve an operable n-channel enhancement-mode MOSFET with a gate oxide 24 thickness of 30 nm and a platinum metal gate electrode 26.

Referring again to FIG. 3, as illustrated in step 58, a gate oxide layer 24 is formed overlying epitaxial layer structure 14. Methods of forming gate-quality oxides overlying III-V compound semiconductor substrates are known. One method for forming a gate-quality oxide overlying a III-V compound semiconductor substrate is disclosed in U.S. Pat. No. 6,159,834, issued to Yu et al, on Dec. 12, 2000, which patent in its entirety is herein incorporated by reference.

As illustrated in step 60, source and drain ohmic contacts 28, 30 are deposited overlying epitaxial layer structure 14 using standard processes well known in the semiconductor industry.

Next, as illustrated in step 62, metal gate electrode 26 is formed overlying gate oxide layer 24. Metal gate electrode 26 is formed by depositing a metal layer overlying gate oxide layer 24 and subsequently patterning the metal layer using standard lithography and lift-off or etching techniques, as is well known in the semiconductor industry. As described above, the material for metal gate electrode 26 may be selected based on a relationship with the dopant level of doped layers 22.

Figure 4:
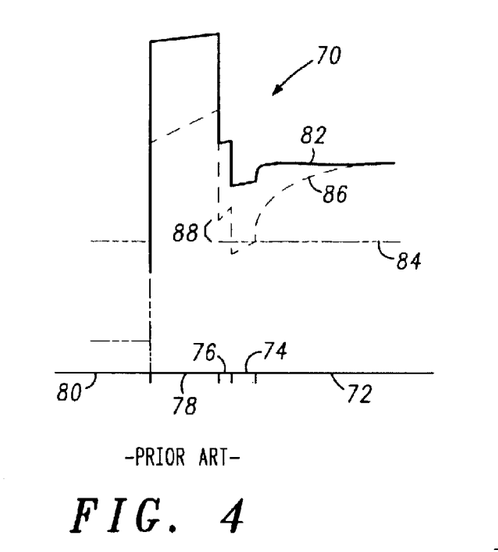
FIG. 4 illustrates an energy band diagram for an enhancement mode metal-oxide semiconductor field effect transistor of the prior art.

One embodiment of the present invention can be explained using simplified energy band diagrams. FIG. 4 illustrates a simplified energy band diagram 70 for an EMOSFET of the prior art, that is, an EMOSFET having ion-implanted source and drain extensions. Represented on the energy band diagram 70 is a III-V compound semiconductor substrate 72, a undoped channel layer 74, a spacer layer 76, a gate oxide layer 78, a metal gate electrode 80, a Fermi level 84, a conduction band edge in off state 82, and a conduction band edge in on-state 86. As illustrated in FIG. 4, the Fermi level at the interface between gate oxide layer 78 and the spacer layer 76 moves from about midgap in the off state into the vicinity of the spacer layer conduction band edge when the EMOSFET is switched from off-state into on-state. In the specific embodiment shown in FIG. 4, the conduction band edge ($E_c$) is only about 0.2 eV above the Fermi level in on-state, as indicated by reference number 88.

Figure 5:
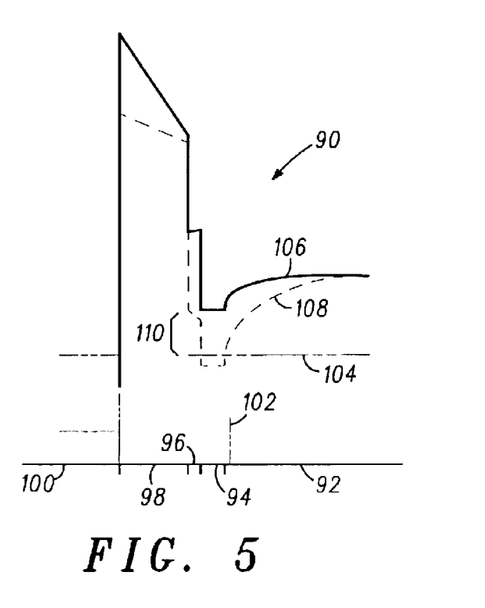
FIG. 5 illustrates an energy band diagram for an enhancement mode metal-oxide-semiconductor field effect transistor in accordance with an exemplary embodiment of the present invention.

FIG. 5 illustrates a simplified energy band diagram 90 for an EMOSFET in accordance with an exemplary embodiment of the present invention. Represented on the energy band diagram 90 is a III-V compound semiconductor substrate 92, a channel layer 94, a spacer layer 96, a gate oxide layer 98, a metal gate electrode 100, a Fermi level 104, a conduction band edge in off state 106, and a conduction band edge in on-state 108. Also shown is a doped layer 102. As illustrated in FIG. 5, the Fermi level 104 at the interface between the gate oxide 98 and the spacer layer 96 does not move into the vicinity of the spacer layer conduction band edge when the device is switched from the off-state into the on-state. In the specific embodiment shown in FIG. 5, the conduction band edge ($E_c$) is about 0.5 eV above the Fermi level in on-state, as indicated by reference number 110.

Figure 6:
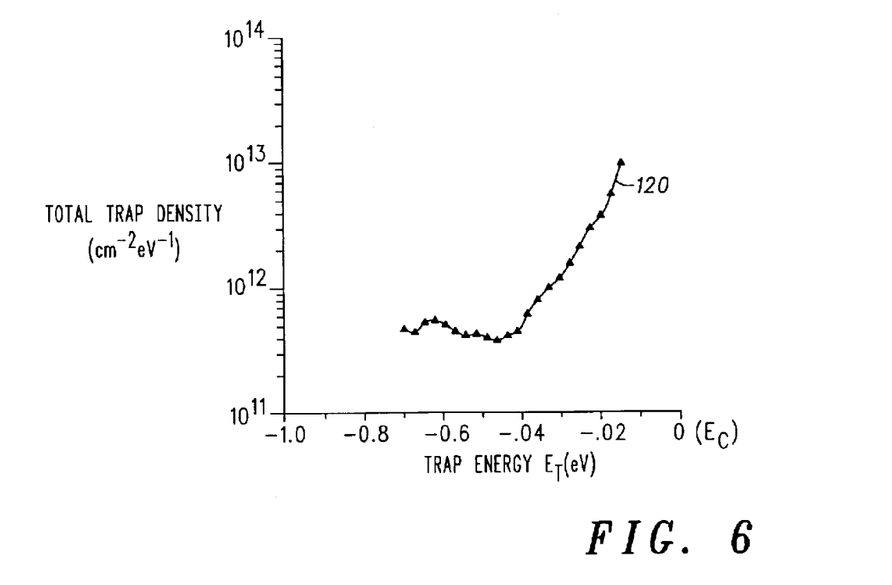
FIG. 6 is a graphical representation of a measured relationship between the trap energy and total trap density at a gallium oxide/gallium arsenide interface of a metal-oxide-semiconductor capacitor in accordance with an exemplary embodiment of the present invention.

FIG. 6 illustrates graphically the measured relationship between the trap energy $E_T$ and the total trap density with reference to the conduction band edge $E_c$ for an $Ga_2O_3$—GaAs interface. As the Fermi level moves toward $E_c$, traps of energy $E_T$ below the Fermi level are occupied (charged) and traps of energy $E_T$ above the Fermi level remain empty (neutral). As illustrated by curve 120, the total density of charged traps for the Fermi level being 0.2 eV below $E_c$ (approximately $4 \times 10^{12}$ cm$^{-2}$ eV$^{-1}$), such as that illustrated in FIG. 4 for the prior art, is significantly higher than the total density of charged traps for the Fermi level being 0.5 eV below $E_c$ (approximately $4 \times 10^{11}$ cm$^{-2}$ eV$^{-1}$), such as that illustrated in FIG. 5.

Figure 7:
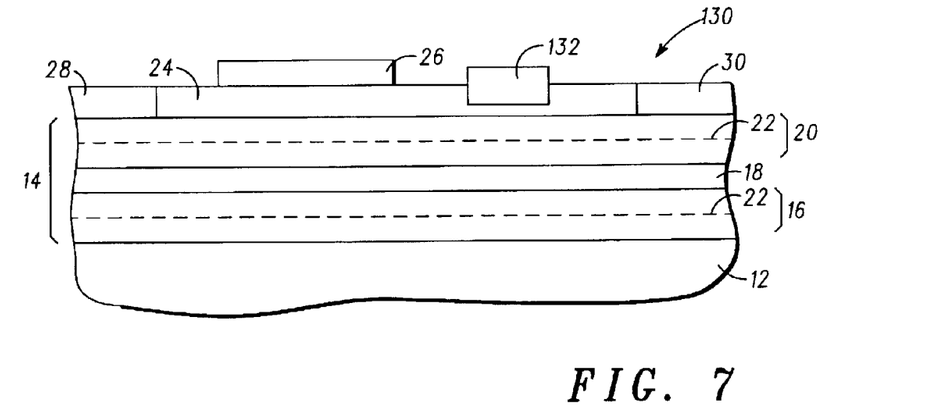
FIG. 7 illustrates schematically, in cross section, an enhancement mode metal-oxide-semiconductor field effect transistor in accordance with another exemplary embodiment of the present invention.

FIG. 7 illustrates schematically, in cross section, an enhancement mode compound semiconductor MOSFET device 130 in accordance with another exemplary embodiment of the present invention. Elements of FIG. 7 that have the same reference numbers as FIG. 1 are the same as the corresponding FIG. 1 elements. Device 130 comprises III-V compound semiconductor substrate 12 and epitaxial layer structure 14 that overlies substrate 12. Epitaxial layer structure 14 comprises buffer layer 16, channel layer 18, a spacer layer 20, and one or more doped layers 22. Device 130 further comprises gate oxide layer 24, metal gate electrode 26 and source and drain ohmic contacts 28 and 30.

Device 130 further comprises a field plate 132. Field plate 132 may be used in a variety of devices, including, but not limited to, power devices that require high breakdown voltage. Field plate 132 may be formed overlying gate oxide layer 24 or, as illustrated in FIG. 7, may be formed at least partially recessed within gate oxide layer 24. Field plate 132 may create an equivalent to a lightly doped drain (LDD) region. The partial depletion of free carriers in the area under the field plate may be controlled by at least partially recessing field plate 132 within gate oxide layer 24 and/or fabricating field plate 132 from a metal with a suitable work function.

Figure 8:
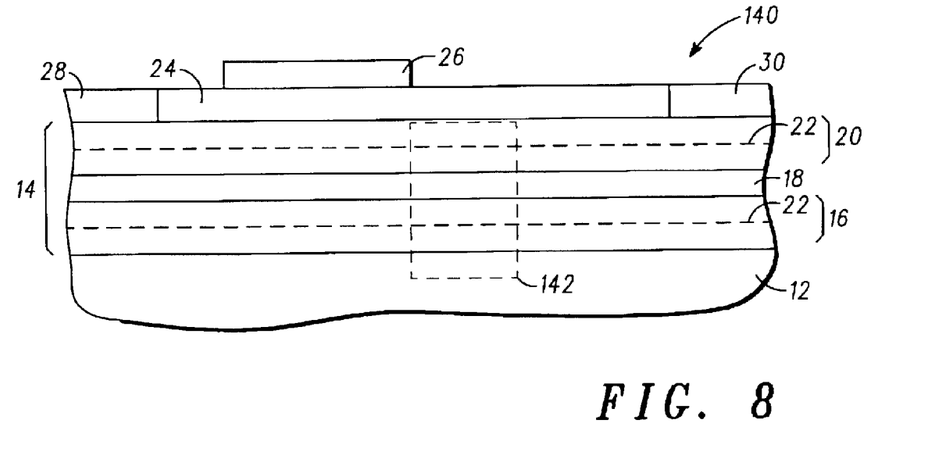
FIG. 8 illustrates schematically, in cross section, an enhancement mode metal-oxide-semiconductor field effect transistor in accordance with a further exemplary embodiment of the present invention.

Referring to FIG. 8, in another exemplary embodiment of the invention, a device 140 may utilize a low dose implantation of a conductivity type opposite to that of doped layers 22 to reduce free carrier concentration in an LDD region 142 in epitaxial layer structure 14. LDD regions are well known and widely used in semiconductor devices such as MOSFETs. In the case of n-channel devices, low dose acceptor implantation may require a thermal annealing step at temperatures of about 600° C., which is compatible with the thermal budget of the gate oxide-epitaxial layer structure interface.

Figure 9:
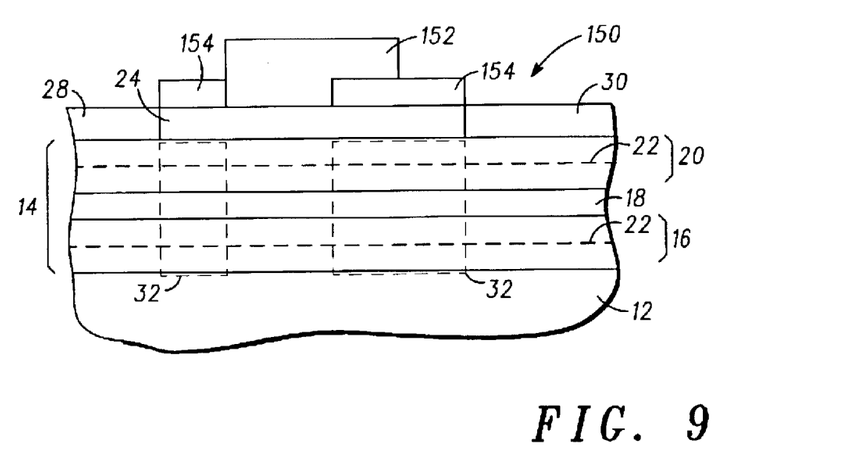
FIG. 9 illustrates schematically, in cross section, an enhancement mode metal-oxide-semiconductor field effect transistor in accordance with yet another exemplary embodiment of the present invention.

It will be appreciated that any number of other modifications can be made to the EMOSFET of the present invention to arrive at various configurations suitable for desired applications. For example, FIG. 9 illustrates, schematically, in cross section, an enhancement mode compound semiconductor MOSFET device 150 in accordance with yet a further exemplary embodiment of the present invention. Elements of FIG. 9 that have the same reference numbers as FIG. 1 are the same as the corresponding FIG. 1 elements. Device 150 comprises III-V compound semiconductor substrate 12 and epitaxial layer structure 14 that overlies substrate 12. Epitaxial layer structure 14 comprises buffer layer 16, channel layer 18, a spacer layer 20, and one or more doped layers 22. Device 150 further comprises gate oxide layer 24, and source and drain ohmic contacts 28 and 30. In this exemplary embodiment, device 150 further comprises a metal step gate electrode 152. As described above with reference to metal gate electrode 26, metal step gate electrode 152 may be selected to have a work function such that, for a particular MOSFET configuration, enhancement mode operation is achieved Metal step gate electrode 152 is isolated from drain access region 32 by a dielectric layer 154. Dielectric layer 154 may comprise silicon nitride, silicon oxide or any other suitable insulating material.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An implant-free enhancement mode metal-oxide semiconductor field effect transistor (EMOSFET) comprising:
   a III-V compound semiconductor substrate;
   an epitaxial layer structure overlying said III-V compound semiconductor substrate, said epitaxial material layer comprising a channel layer and at least one doped layer;
   a gate oxide layer overlying said epitaxial layer structure;
   a metal gate electrode overlying said gate oxide layer; and source and drain ohmic contacts overlying said epitaxial layer structure;

wherein said EMOSFET is without source and drain extension implants of the same dopant type as the at least one doped layer.

2. The implant-free EMOSFET of claim 1, said at least one doped layer comprising a delta-doped layer.

3. The implant-free EMOSFET of claim 1, said epitaxial layer structure comprising a spacer layer overlying said channel layer and underlying said gate oxide layer.

4. The implant-free EMOSFET of claim 3, said spacer layer comprising aluminum gallium arsenide (AlGaAs).

5. The implant-free EMOSFET of claim 1, said channel layer comprising indium gallium arsenide (InGaAs).

6. The implant-free EMOSFET of claim 1, said III-V compound semiconductor substrate comprising gallium arsenide (GaAs).

7. The implant-free EMOSFET of claim 1, said gate oxide comprising $Ga_2O_3$.

8. The implant-free EMOSFET of claim 1, further comprising a field plate positioned at least partially within said gate oxide.

9. The implant-free EMOSFET of claim 1, further comprising a field plate positioned overlying said gate oxide.

10. The implant-free EMOSFET of claim 1, further comprising a low dose implantation region positioned within said epitaxial layer structure, said low dose implantation region of a conductivity type opposite to said at least one doped layer.

11. The implant-free EMOSFET of claim 1, wherein said metal gate electrode is a metal step gate electrode.

12. An enhancement mode metal-oxide semiconductor field effect transistor (EMOSFET) comprising:

a III-V compound semiconductor substrate;

an epitaxial layer structure overlying said III-V compound semiconductor substrate, said epitaxial layer structure comprising a channel layer and at least one delta-doped layer;

a gate oxide layer overlying said epitaxial layer structure;

a metal gate electrode overlying said gate oxide layer, said metal gate electrode having a work function; and source and drain ohmic contacts overlying said epitaxial layer structure;

wherein said metal gate electrode is selected to have said work function and said delta-doped layer is doped to a level so that enhancement mode operation is achieved.

13. The EMOSFET of claim 12, said III-V compound semiconductor substrate comprising gallium arsenide (GaAs).

* * * * *